(12) United States Patent
Inaba et al.

(10) Patent No.: US 7,471,549 B2
(45) Date of Patent: Dec. 30, 2008

(54) SEMICONDUCTOR MEMORY DEVICE

(75) Inventors: Tsuneo Inaba, Kamakura (JP); Kenji Tsuchida, Kawasaki (JP); Yoshiaki Fukuzumi, Palo Alto, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 11/390,254

(22) Filed: Mar. 28, 2006

(65) Prior Publication Data
US 2007/0058424 A1 Mar. 15, 2007

(30) Foreign Application Priority Data
Sep. 13, 2005 (JP) ............................. 2005-265343

(51) Int. Cl.
*G11C 11/00* (2006.01)
(52) U.S. Cl. ..................... 365/158; 365/148; 365/171
(58) Field of Classification Search ................ 365/158, 365/148, 171
See application file for complete search history.

(56) References Cited

U.S. PATENT DOCUMENTS 6,868,005 B2 * 3/2005 Hidaka ....................... 365/171
7,085,174 B2 * 8/2006 Hidaka ....................... 365/158
2004/0081004 A1 * 4/2004 Okazawa ..................... 365/200

FOREIGN PATENT DOCUMENTS

JP 2002-170376 6/2002

OTHER PUBLICATIONS

U.S. Appl. No. 11/065,143, filed Feb. 24, 2005, Tsuneo Inaba.
U.S. Appl. No. 11/298,597, filed Dec. 12, 2005, Ryousuke Takizawa et al.
Mark Durlam, et al., "A 1-Mbit MRAM Based on 1T1MTJ Bit Cell Integrated With Copper Interconnects", IEEE Journal of Solid-State Circuits, vol. 38, No. 5, May 2003, pp. 769-773.
A. Bette, et al., "A High-Speed 128Kbit MRAM Core for Future Universal Memory Applications", Symposium on VLSI Circuits Digest of Technical Papers, Jun. 2003, pp. 217-220.

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes a write line, at least three first data-writing circuits which are connected to the write line, and memory cells which include a magnetoresistive element, are connected electrically and/or magnetically to the write line, and are arranged between the first data-writing circuits.

13 Claims, 9 Drawing Sheets

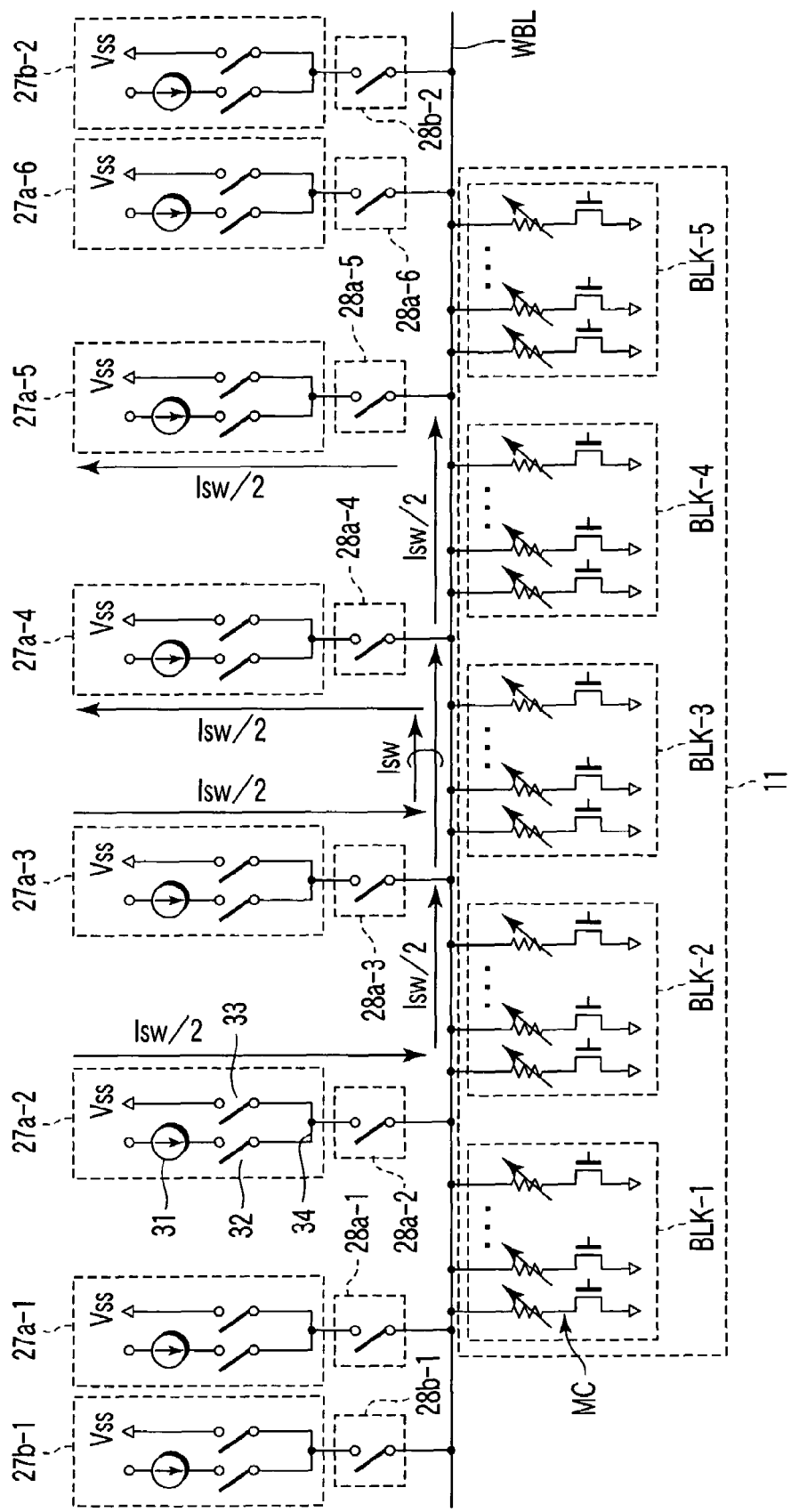
F I G. 5

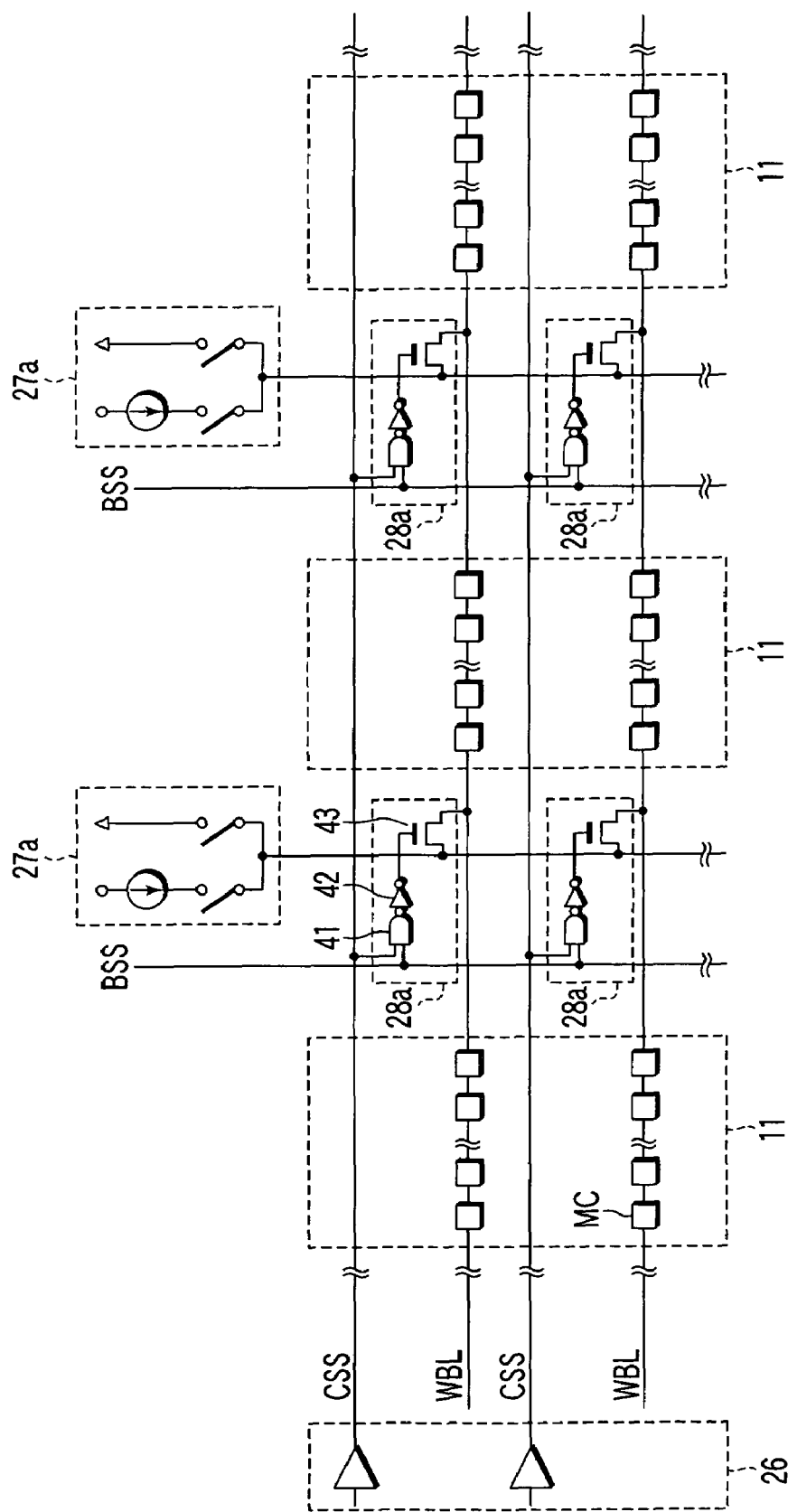
F I G. 6

SEMICONDUCTOR MEMORY DEVICE

CROSS-REFERENCE TO RELATED APPLICATIONS

This application is based upon and claims the benefit of priority from prior Japanese Patent Application No. 2005-265343, filed Sep. 13, 2005, the entire contents of which are incorporated herein by reference.

BACKGROUND OF THE INVENTION

1. Field of the Invention

The present invention relates to a semiconductor memory device. More particularly, the invention relates to a magnetic memory device having memory cells that include magnetoresistive effect elements.

2. Description of the Related Art

Magnetic memory devices are known as one kind of a semiconductor memory device. Various types of magnetic memory devices have been proposed. In recent years, magnetic random access memories (MRAM) have been proposed, which comprise magnetoresistive effect elements that exhibit a giant magnetoresistive effect. Particularly, MRAMs that have ferromagnetic tunnel junction attract attention. Since MRAMs are highly nonvolatile, operate at high speed, have high integration density and are highly reliable, they are regarded as memory devices that may replace dynamic random access memories (DRAM), electrically erasable programmable read only memories (EEPROM) and are being developed. See Mark Durlam et al., "A 1-Mbit MRAM Based on 1T1MTJ Bit Cell Integrated With Copper Interconnects," IEEE Journal of Solid-State Circuits, Vol. 38, No. 5, May 2003, pp. 759-773, and J. DeBrosse et al., "A 16 Mb MRAM Featuring Boostrapped Write Devices," 2004 Symposium on VLSI Circuits Digest of Technical Papers, pp. 454-457.

Magnetic tunnel junction (MTJ) elements for use in the memory cells of the MRAM have, for example, a first ferromagnetic layer, a second ferromagnetic layer, and an insulating layer interposed between the ferromagnetic layers. An MTJ element has a tunneling magnetoresistive effect; its tunneling current changes in accordance with whether the spin directions of the ferromagnetic layers are parallel or anti-parallel. In the MRAM, each memory cell stores data 0 when the MTJ element has low resistance, and data 1 when the MTJ element has high resistance.

In most MRAMs, a current is made to flow in each write line, generating a magnetic field. Data is thereby written into an MTJ element connected to the write line. That is, the data is indirectly written into the MTJ element, not directly as into the memory cells of ordinary semiconductor memories. Inevitably, a relatively large current must flow in the write line to write the data into the MTJ element. To be more specific, a current of about several milliamperes to tens of milliamperes flow in the write line.

To supply this large write current to any selected write line, the MRAM must have a large current-supplying circuit, a large current-sinking circuit, and a large switch circuit for supplying the current to, and sinking it from, the selected write line. Consequently, the MRAM will be a large chip, and the manufacturing cost of the chip will increase. Further, the circuit (i.e., transistors) connected to the write lines must be large, unavoidably increasing the parasitic capacitance of the write lines, inevitably increasing the data-reading speed if the write lines are used as read lines, too. To increase the data-reading speed, read lines may be provided in addition to the write lines, as is disclosed in Jpn. Pat. Appln. KOKAI Publication No. 2002-170376.

BRIEF SUMMARY OF THE INVENTION

According to an aspect of the present invention, there is provided a semiconductor memory device comprising:
a write line;
at least three first data-writing circuits which are connected to the write line; and
memory cells which include a magnetoresistive element, are connected electrically and/or magnetically to the write line, and are arranged between the first data-writing circuits.

BRIEF DESCRIPTION OF THE SEVERAL VIEWS OF THE DRAWING

FIG. 5 is a circuit diagram illustrating another configuration of the MRAM shown in FIG. 3;

FIG. 6 is a circuit diagram illustrating the switch circuit 28a shown in FIG. 3;

FIG. 10 is a circuit diagram illustrating a major section of an MRAM in which memory cell blocks BLK share one sense amplifier circuit 29a.

DETAILED DESCRIPTION OF THE INVENTION

Figure 1:
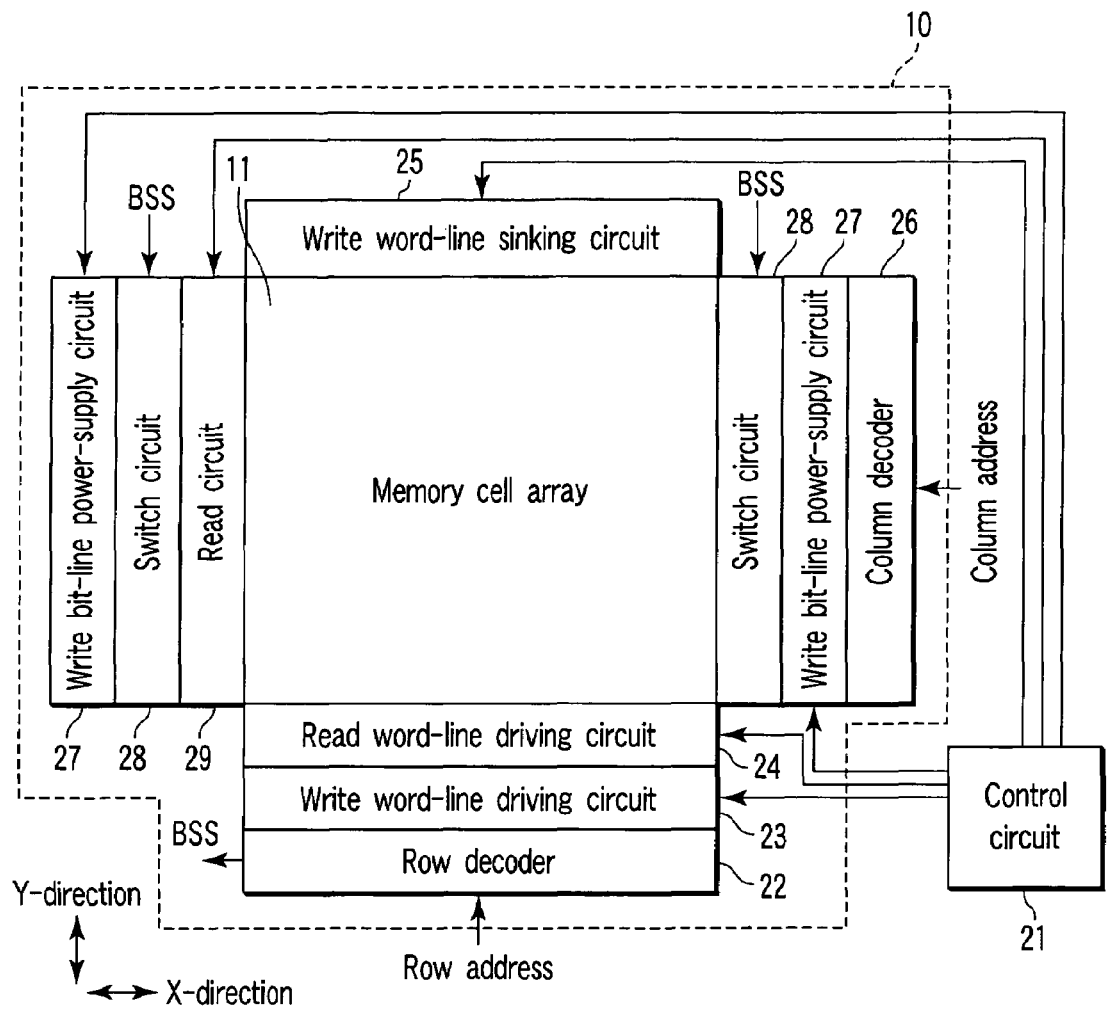
FIG. 1 is a block diagram illustrating an MRAM according to a first embodiment of the invention.

Embodiments of the present invention will be described, with reference to the accompanying drawings. In the following description, components identical in function and structure will be designated at the same reference numerals and will be repeatedly described, only if necessary.

First Embodiment

FIG. 1 is a block diagram illustrating an MRAM according to a first embodiment of the invention. The MRAM comprises a control circuit 21 and core circuit unit 10. A plurality of core circuit units are provided as in most cases. The core circuit unit 10 has a memory cell array 11, a row decoder 22, a write word-line driving circuit 23, a read word-line driving circuit 24, and a write word-line sinking circuit 25.

The memory cell array 11 has a plurality of memory cells MC. Each of the memory cells MC includes an MTJ element. Write bit lines WBL, Write word lines WWL and read word lines RWL are arranged over the memory cell array 11. The bit lines WBL extend a X-direction. The word lines WWL and RWL extend a Y-direction.

The row decoder 22 selects one of the memory-cell rows provided in the memory cell array 11 in accordance with a row address supplied from an external device. (The memory-cell rows extend in the Y-direction as shown in FIG. 1.)

The write word-line driving circuit 23 supplies a write current to one of the write word lines WWL, which accords with the result of selection performed by the row decoder 22. The write word-line sinking circuit 25 sinks a write current from the write word line WWL that is provided for the memory-cell row selected by the row decoder 22. That is, the write current flows from the write word-line driving circuit 23 to the write word line WWL and flows back to the write word-line sinking circuit 25.

The read word-line driving circuit 24 supplies a read voltage to one of the read word lines RWL, which accords with the result of selection performed by the row decoder 22.

The core circuit unit 10 further has a column decoder 26, a write bit-line power-supply circuit 27 as a data-writing circuit, a switch circuit 28, and a read circuit 29. The column decoder 26 selects one of the memory-cell columns provided in the memory cell array 11 in accordance with a column address supplied from the external device. (The memory-cell columns extend in the X-direction as shown in FIG. 1.)

The read circuit 29 (including a plurality of sense amplifier circuits) detects and amplifies the current flowing in (or voltage applied on) any memory cell MC to read data from the memory cell MC. The write bit-line power-supply circuit 27 and the switch circuit 28 will be later described in terms of configuration and operation.

Figure 2:
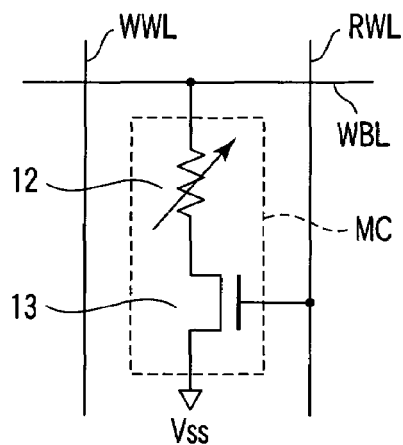
FIG. 2 is a circuit diagram illustrating an example of a memory cell MC.

FIG. 2 is a circuit diagram illustrating an example of a memory cell MC. The memory cell MC comprises an MTJ element 12 and a selection transistor 13. The element 12 and the transistor 13 are connected in series between a write bit line WBL and, for example, the ground potential Vss. More precisely, the MTJ element 12 is connected at one end to the write bit line WBL, and at the other end to the drain terminal of the selection transistor 13. The source terminal of the transistor 13 is connected to the ground potential Vss.

The gate electrode of the selection transistor 13 is connected to a read word line RWL. A write word line WWL extends parallel to the read word line RWL and is arranged close to the MTJ element 12.

The MTJ element 12 is not limited in terms of structure. An example will be described. The MTJ element 12 comprises a fixed layer (or pinned layer), a recording layer (or free layer), and a non-magnetic layer (e.g., tunnel insulating layer) interposed between the fixed layer and the recording layer.

The fixed layer is constituted by a ferromagnetic layer that is fixed in direction of magnetization. To be more specific, the fixed layer comprises a ferromagnetic layer and an anti-ferromagnetic layer, which prevents the ferromagnetic layer from changing in magnetization direction. The recording layer is composed of a ferromagnetic layer in which the direction of magnetization is reversed depending on the magnetic field applied to it.

The MTJ element 12 has a tunneling magnetoresistive effect; its tunneling current changes in magnitude as the spin directions of the recording layer and fixed layer become parallel or anti-parallel. More precisely, the tunneling current increases and the resistance of the MTJ element 12 decreases, when the spin directions of these layers become parallel. On the other hand, when the spin directions become anti-parallel, the tunneling current decreases and the resistance increases. In the MRAM, the memory cell MC stores data 0 when the MTJ element 12 has low resistance, and stores data 1 when the MTJ element 12 has high resistance.

A description will be given of write operation and read operation of the memory cell MC constructed as the above. First, it will be explained how data is written to the memory cell MC. The write word-line driving circuit 23 and write word-line sinking circuit 25 supply a write current to the write word line WWL, said write current flowing from the write word-line driving circuit 23 toward the write word-line sinking circuit 25. The write bit-line power-supply circuit 27 supplies a write current (corresponding to data 0 or data 1) to the write bit line WBL, said write current flowing in the direction corresponding to the data to be written. The magnetization direction of the recording layer of the MTJ element 12 is thus controlled, writing data in the memory cell MC.

How data is read from the memory cell MC will be described. First, the read word-line driving circuit 24 set the read word line RWL to high level. The selection transistor 13 incorporated in the memory cell MC is therefore turned on. The read circuit 29 reads the data from the memory cell MC through, for example, the write bit line WBL. In this embodiment, the write bit lines WBL are used to read data from the memory cells MC. In other words, the write bit lines WBL function as not only write bit lines, but also read bit lines.

Figure 3:
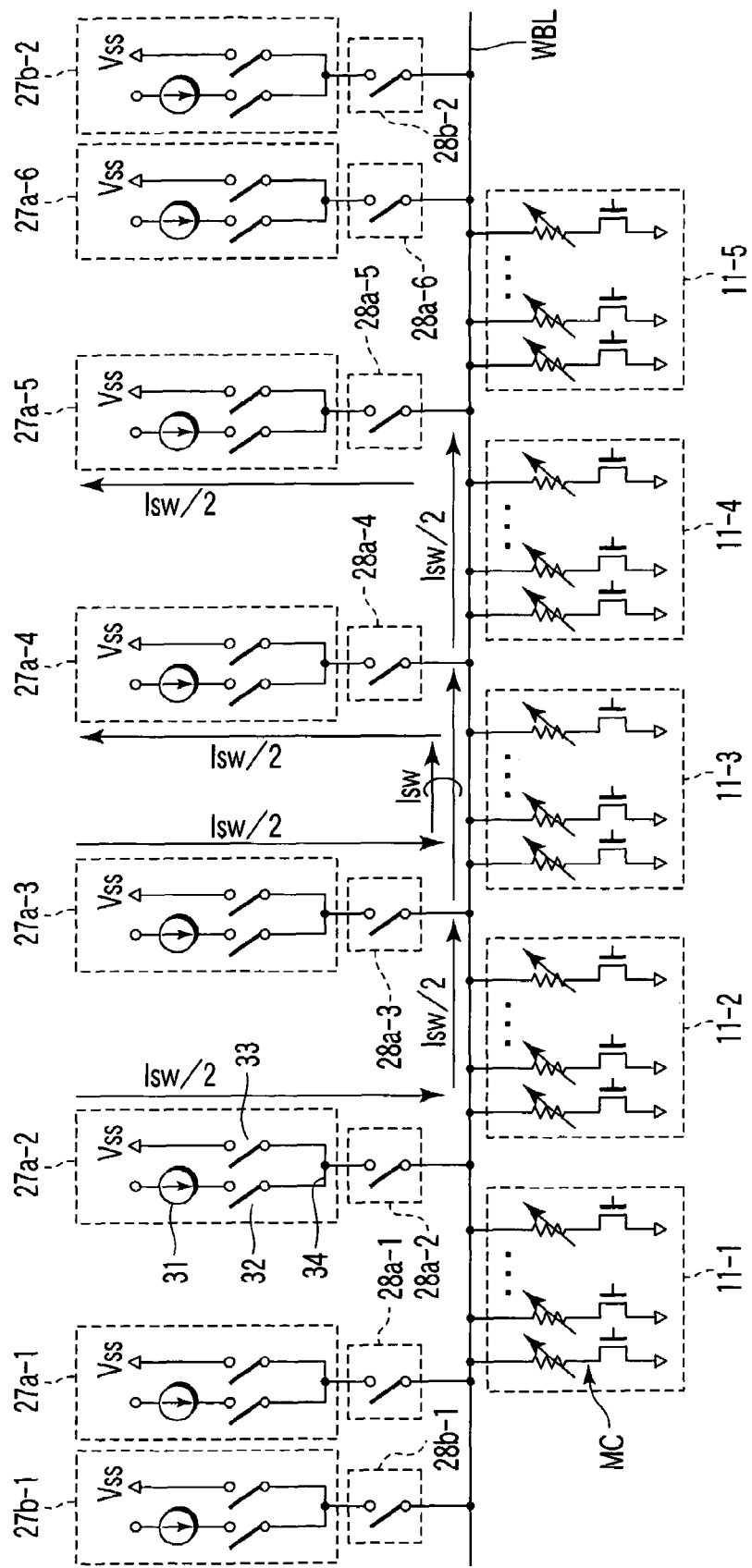
FIG. 3 is a circuit diagram illustrating the write bit-line power-supply circuit 27 and switch circuit 28 shown in FIG. 1.

FIG. 3 is a circuit diagram illustrating the write bit-line power-supply circuit 27 and switch circuit 28 shown in FIG. 1. In FIG. 3, only one write bit line WBL is shown, and a part of the bit-line power-supply circuit 27 and a part of the switch circuit 28 are illustrated, which correspond to the write bit line.

Each of the memory cell arrays 11 comprises a plurality of memory cells MC. A plurality of memory cell arrays 11 are connected to one write bit line WBL. (In FIG. 3, five memory cell arrays 11-1 to 11-5 are connected to the write bit line WBL, for the sake of explanation.)

In FIG. 3, only one of the write bit lines WBL which are arranged in the memory cell arrays 11 are illustrated. In fact, write bit lines WBL are arranged in the memory cell array 11.

The write bit-line power-supply circuit 27 comprises write bit-line power-supply circuits (data-writing circuits) 27a and write bit-line power-supply circuits (data-writing circuits) 27b. Of these write bit-line power-supply circuits, for example, a predetermined number of bit-line power-supply circuits 27a (in this embodiment, six circuits 27a-1 to 27a-6) and two circuits 27b-1 and 27b-2 are connected to the write bit line WBL. This embodiment is characterized in that at least three write bit-line power-supply circuits 27a are connected to one write bit line WBL.

Each write bit-line power-supply circuit 27a and each write bit-line power-supply circuit 27b have a write-current supplying circuit and a write-current sinking circuit, respectively. More precisely, each write bit-line power-supply circuits 27a and each write bit-line power-supply circuit 27b have a constant-current source 31, switch circuits 32 and 33, a common power-supply line 34, and ground potential Vss (or a terminal set to the ground potential Vss). The switch circuits 32 and 33 are, for example, transistors.

The constant-current source 31 is connected to one terminal of the switch circuit 32. The other terminal of the switch circuit 32 is connected to the common power-supply line 34. The ground potential Vss is connected to one terminal of the switch circuit 33. The other terminal of the switch circuit 33 is connected to the common power-supply line 34.

The write bit-line power-supply circuit included in the write bit-line power-supply circuit includes the constant-current source 31 and the switch circuit 32. The write-current sinking circuit included in the write bit-line power-supply circuit includes the ground potential Vss and the switch circuit 33. The write bit-line power-supply circuit and the write-current sinking circuit are connected by the common power-supply line 34.

Each write bit-line power-supply circuit 27*a* and each write bit-line power-supply circuit 27*b* supply write current Isw/2, which is half the write current Isw required to write data into the memory cell MC. That is, the write bit-line power-supply circuits 27*a* and 27*b* have half current supply ability, supplying half the write current Isw. The write bit-line power-supply circuits 27*a* and 27*b* sink the write current Isw/2 from the write bit line WBL.

The switch circuit 28 includes switch circuits 28*a* and switch circuits 28*b*. The switch circuits 28*a* are provided for the write bit-line power-supply circuits 27*a*, respectively. The switch circuits 28*b* are provided for the write bit-line power-supply circuits 27*b*, respectively. The switch circuits 28*a* connect the power-supply circuits 27*a* to the write bit line WBL. The switch circuits 28*b* connect the power-supply circuits 27*b* to the write bit line WBL.

To be more specific, the switch circuit 28*a* is connected between the write bit line WBL and the common power-supply line 34 of one power-supply circuit 27*a*. Similarly, the switch circuit 28*b* is connected between the write bit line WBL and the common power-supply line 34 of one power-supply circuit 27*b*. In FIG. 3, six switch circuits 28*a*-1 to 28*a*-6 and two switch circuit 28*b*-1 and 28*b*-2 are illustrated.

The memory cell arrays 11-1 to 11-5 are arranged, respectively between the power-supply circuits 27*a*-1 to 27*a*-6. The write bit-line power-supply circuits 27*b*-1 and 27*b*-2 are arranged at both ends of the write bit-line power-supply circuits 27*a*-1 to 27*a*-6 and adjacent to the write bit-line power-supply circuits 27*a*-1 and 27*a*-6. Thus, no memory cell arrays are provided between the write bit-line power-supply circuits 27*a*-1 and 27*b*-1. No memory cell arrays are provided between the write bit-line power-supply circuits 27*a*-6 and 27*b*-2, either.

A description will be given of a write operation of the MRAM constructed as the above. Consider how data 1 is written in one of the memory cells MC arranged in, for example, the memory cell array 11-3. Assume that data 1 is written in the memory cell MC when write current flows in the write bit line WBL, from the left to the right in FIG. 3.

To write data to one of the memory cells MC arranged in the memory cell array 11-3, four write bit-line power-supply circuits, i.e., circuits 27*a*-2, 27*a*-3, 27*a*-4 and 27*a*-5, are activated. Note that the circuits 27*a*-2 and 27*a*-3 are located on the left of the memory cell array 11-3, and the circuits 27*a*-4 and 27*a*-5 on the right of the memory cell array 11-3.

First, the write bit-line power-supply circuits 27*a*-2 and 27*a*-3 are activated. That is, the switch circuits 32 of the circuits 27*a*-2 and 27*a*-3 are turned on. Then, the switch circuits 28*a*-2 and 28*a*-3 are turned on. The write bit-line power-supply circuits 27*a*-2 and 27*a*-3 therefore supply write current Isw/2 to the write bit line WBL.

At the same time, the write-current-sinking circuits of the power-supply circuits 27*a*-4 and 27*a*-5 are activated. That is, the switch circuits 33 of the circuits 27*a*-4 and 27*a*-5 are turned on. Further, the switch circuits 28*a*-4 and 28*a*-5 are turned on. Write current Isw/2 is therefore sunk from the write bit line WBL.

As a result, write current Isw (=Isw/2+Isw/2) flows in that part of the write bit line WBL which passes by the memory cell array 11-3. Thus, data 1 is written into one of the memory cells MC of the memory cell array 11-3. At this time, the write word line WWL corresponding to said memory cell MC is activated at this time.

Write current Isw/2 flows in those part of the write bit line WBL that passes by two memory cell arrays 11-2 and 11-4 adjacent to the memory cell array 11-3. Nonetheless, no data is written in the memory cells MC of the memory cell array 11-2 and 11-4 because current Isw/2 is smaller than the current required to write data into the memory cells MC.

The write bit-line power-supply circuit 27*b*-1 and the switch circuit 28*b*-1 are provided to write data in the memory cells MC of the memory cell array 11-1, i.e., the leftmost memory cell array in FIG. 3. Similarly, the write bit-line power-supply circuit 27*b*-2 and the switch circuit 28*b*-2 are provided to write data in the memory cells of the memory cell array 11-5, i.e., the rightmost memory cell array in FIG. 3. Thus, by providing the write bit-line power-supply circuits 27*b*-1 and 27*b*-2, write current Isw can be supplied to the memory cell arrays 11-1 and 11-5, too, which are provided at the ends of the write bit line WBL.

It will be explained how data 1 is written in, for example, one of the memory cells MC provided in the memory cell array 11-1. In this case, the write bit-line power-supply circuits 27*b*-1, 27*a*-1, 27*a*-2 and 27*a*-3 are activated. To be more specific, the switch circuit 32 is activated for the write bit-line power-supply circuits 27*b*-1 and 27*a*-1. The switch circuit 33 is activated for the write bit-line power-supply circuits 27*a*-2 and 27*a*-3. Further, the switch circuits 28*b*-1, 28*a*-1, 28*a*-2 and 28*a*-3 are activated.

Hence, write current Isw flows in that part of the write bit line WBL which passes by the memory cell array 11-1. As a result, data 1 is written in the memory cell MC provided in the memory cell array 11-1. No data is written in the memory cells MC provided in the memory cell array 11-2, because only current Isw/2 flows in that part of the write bit line WBL which passes by the memory cell array 11-2.

Figure 4:
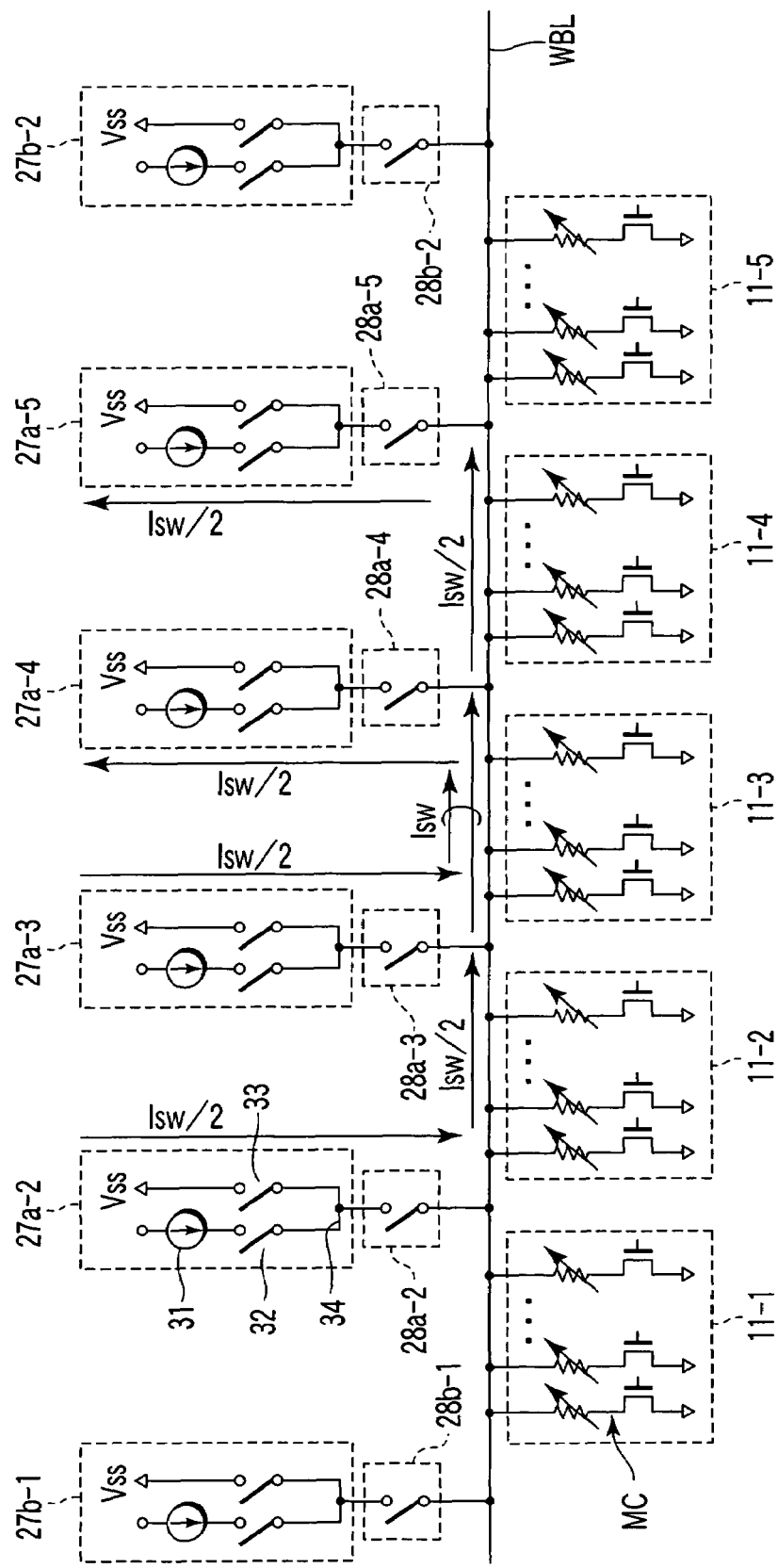
FIG. 4 is a circuit diagram illustrating another configuration of the write bit-line power-supply circuit 27.

FIG. 4 is a circuit diagram illustrating another configuration of the write bit-line power-supply circuit 27. As FIG. 4 shows, constant-current sources 31 and switch circuits 32, 33 are provided in the write bit-line power-supply circuits 27*b*-1 and 27*b*-2. The sources 31 and circuits 32, 33 are, respectively, may be set to have twice as a current drive ability.

Write bit-line power-supply circuits 27*a*-2 to 27*a*-5 are arranged between the memory cell arrays 11-1 to 11-5. The write bit-line power-supply circuits 27*a*-2 to 27*a*-5 are connected to the write bit line WBL by switch circuits 28*a*-2 to 28*a*-5, respectively. The write bit-line power-supply circuits 27*b*-1 and 27*b*-2 are arranged at the ends of the write bit line WBL, respectively. The write bit-line power-supply circuits 27*b*-1 and 27*b*-2 are connected to the write bit line WBL by switch circuits 28*b*-1 and 28*b*-2, respectively.

The write bit-line power-supply circuits 27*b*-1 and 27*b*-2 shown in FIG. 4 have a current drive ability twice as much as the write bit-line power-supply circuits 27*a*. That is, they supply write current Isw to the write bit line WBL and sinks the current Isw from the write bit line WBL. The switch circuits 28*b*-1 and 28*b*-2 can transfer twice as much a current as the switch circuits 28*a*. Hence, data can be written in each memory cell array 11 even if the write bit-line power-supply circuit 27 is so constituted.

In the above explanation, the memory cell array 11 comprises a plurality of memory cell arrays 11-1 to 11-5. Instead, the memory cell array 11 may comprise a plurality of memory cell blocks BLK, as is illustrated in FIG. 5. An MRAM in which each memory cell array 11 is divided into a plurality of memory cell blocks BLK can operate in the same way as described above. FIG. 5 shows a modification of the configuration shown in FIG. 3. A modification of the configuration shown in FIG. 4 can be similarly applied.

An example of a configuration that each switch circuit 28a may have will be described. FIG. 6 is a circuit diagram illustrating the switch circuit 28a shown in FIG. 3.

Each switch circuit 28a comprises an AND circuit and an N-MOS transistor 43. (The AND circuit is, for example, a series circuit of an NAND circuit 41 and an inverter circuit 42.) The AND circuit receives at one input terminal a column-selecting signal CSS through a column selection line. The column-selecting signal CSS is supplied from the column decoder 26. The column decoder 26 receives a column address signal and activates one of column-selecting signals CSS, which corresponds to the column address signal.

The AND circuit receives at the other input terminal a block-selecting signal BSS through a block selection line. The block-selecting signal BSS is supplied from, for example, the row decoder 22. The row decoder 22 receives a row address signal and activates one of block-selecting signals, which corresponds to the row address signal.

The switch circuit 28a thus configured connects the write bit-line power-supply circuit 27a to the write bit line WBL when the column-selecting signal CSS and the block-selecting signal BSS are set to high level. Note that the switch circuit 28b is identical to the switch circuit 28a in configuration.

A block-selecting signal BSS is supplied to four switch circuits 28a and 28b to supply write current to the memory cell array 11 that is to be selected. The column-selecting signal CSS and the block-selecting signal BSS can turn on the four switch circuits 28a and 28b.

In the present embodiment, the currents supplied from the two power-supply circuits 27a included in the write bit-line power-supply circuit 27 are added, providing current Isw, and this current Isw is supplied to the memory cell arrays, thereby writing data. The current supply ability of the power-supply circuits constituting the write bit-line power-supply circuit 27 can be half as much as in the case where each circuit needs to supply write current Isw. This renders the write bit-line power-supply circuit 27 small.

Since the current is small, the switch circuits 32 and 33 incorporated in the circuit 27a can be small ones. The switch circuits 32 and 33 may be transistors. In this case, the transistors need to have only half the current drive ability. Similarly, the switch circuits 28a and 28b constituting the switch circuit 28 can need to have only half the current drive ability.

The number of write bit-line power-supply circuits 27a and 27b connected to one write bit line WBL is smaller than in the conventional write bit-line power-supply circuit. Hence, the write bit-line power-supply circuit 27 can be smaller.

Since each circuit is small, the chip size of the MRAM can be small. Being small, the MRAM can be inexpensive.

Figure 7:
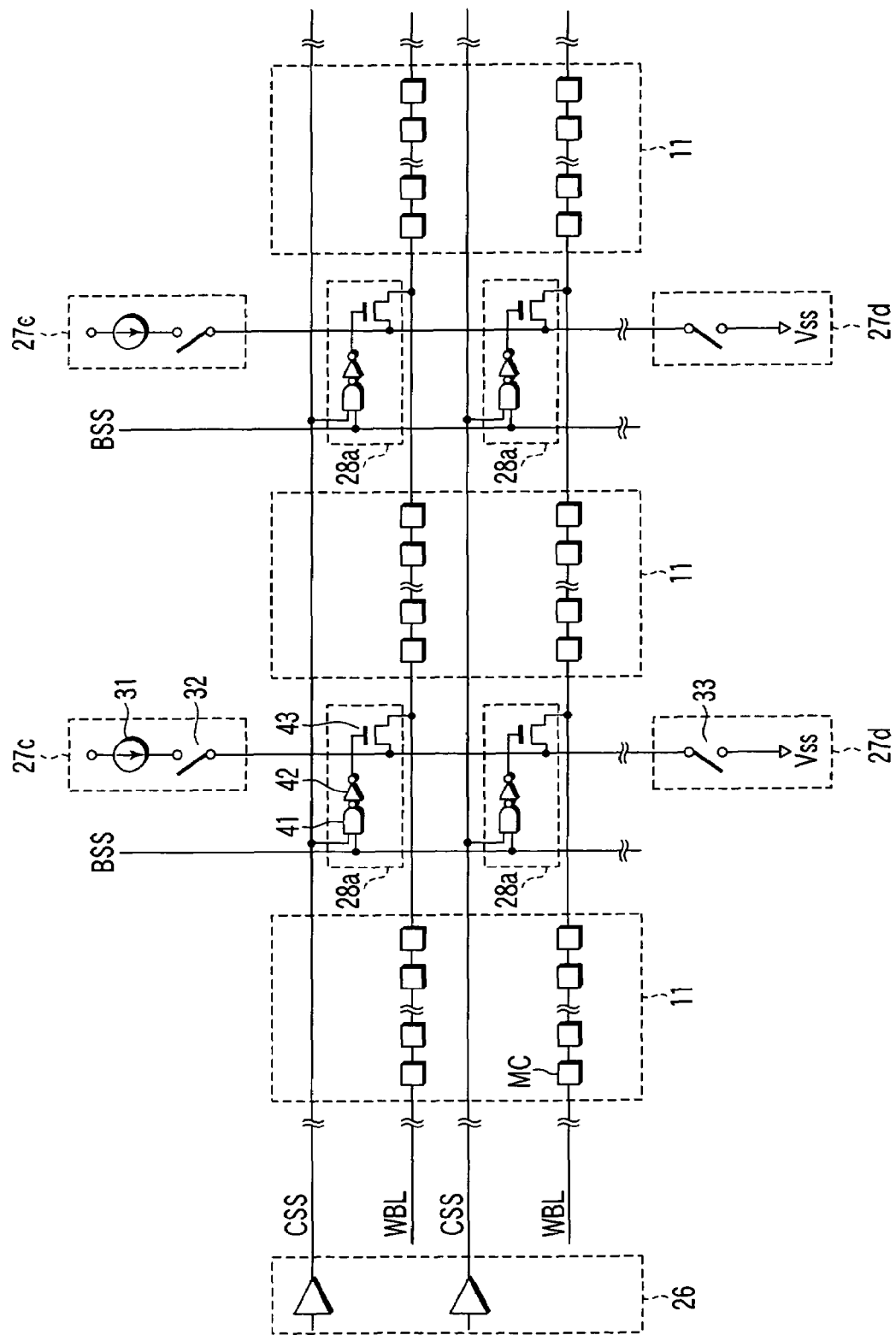
FIG. 7 is a circuit diagram illustrating another arrangement of write-current supplying circuit 27c and write-current sinking circuit 27d.

The positions that the write-current supplying circuits and write-current sinking circuits take in the write bit-line power-supply circuit 27 are not limited to those illustrated in FIG. 6. FIG. 7 shows an example, in which the write-current supplying circuit 27c and the write-current sinking circuit 27d, which are included in the write bit-line power-supply circuits 27a are provided above and below the memory cell array 11, respectively. In other words, the memory cell array 11 is interposed between a plurality of write-current supplying circuits 27c and a plurality of write-current sinking circuits 27d.

The write-current supplying circuit 27c includes a constant-current source 31 and a switch circuit 32. The write-current sinking circuit 27d includes a ground potential Vss and a switch circuit 33.

All write-current supplying circuits 27c are arranged above the memory cell array 11 (FIG. 7), and all write-current sinking circuits 27d below the memory cell array 11 (FIG. 7). Thus, the write bit-line power-supply circuits 27a can be efficiently laid out. As a result, the MRAM can have a small chip size. Alternatively, the write-current supplying circuit 27c may be arranged below the memory cell array 11, and the write-current sinking circuit 27d may be arranged above the memory cell array 11. In this case, too, the MRAM can attain the same advantage.

Figure 8:
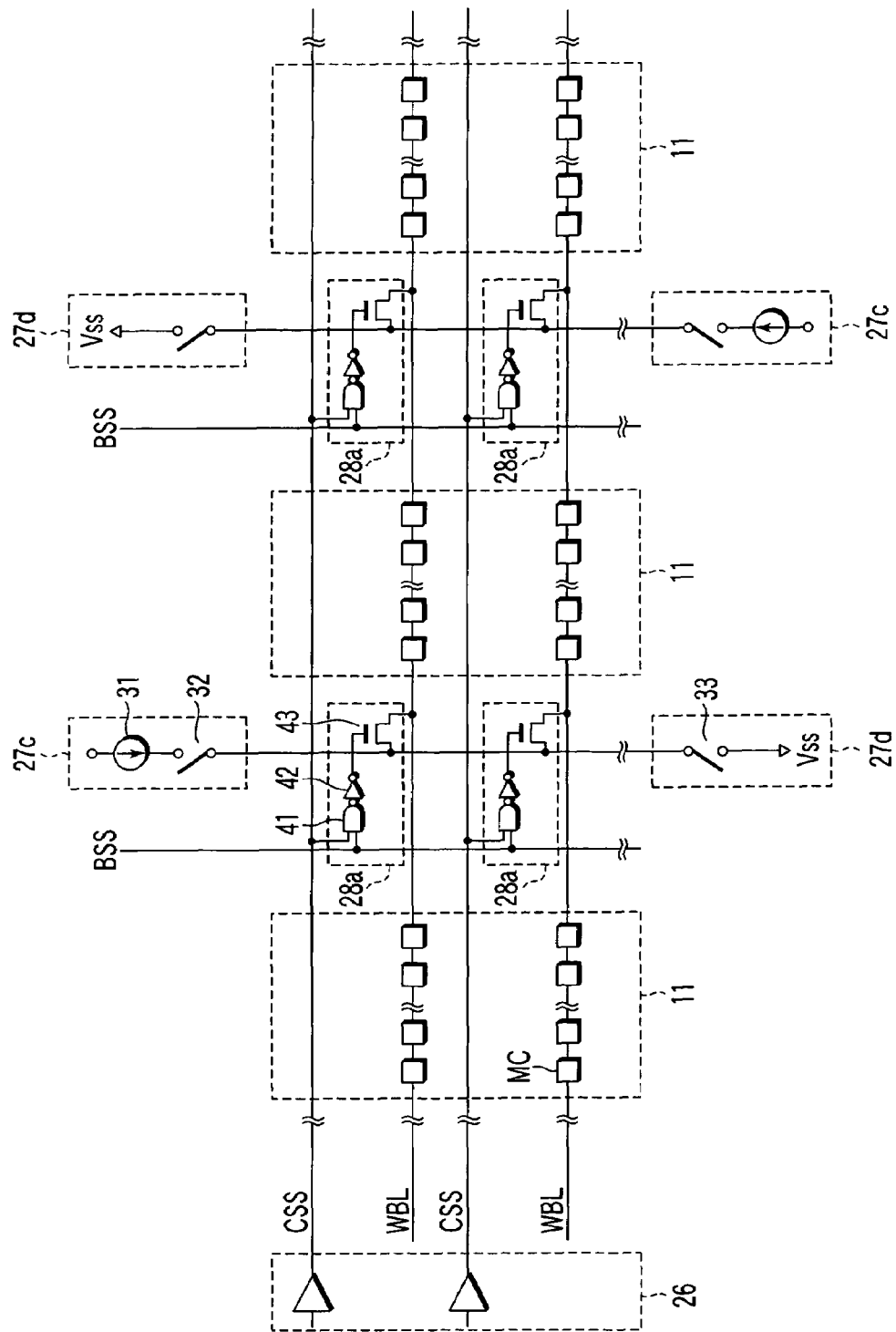
FIG. 8 is a circuit diagram illustrating another arrangement of write-current supplying circuit 27c and write-current sinking circuit 27d.

Moreover, the write-current supplying circuit 27c and the write-current sinking circuit 27d may be arranged alternately (see FIG. 8).

In this configuration, each write-current supplying circuit and each write-current sinking circuit, which simultaneously operate to write data, are spaced apart from each other in the chip. This suppresses local power-supply bounce. A sable data-writing operation can therefore be performed.

This embodiment comprises a plurality of memory cell arrays 11. This invention can be applied to an MRAM in which each memory cell array 11 comprises, as indicated above, a plurality of memory-cell blocks. Such a MRAM can attain similar advantage.

Second Embodiment

A second embodiment of the invention is an MRAM that has read bit lines may be provided in addition to the write bit lines to read data at high speed (see Jpn. Pat. Appln. KOKAI Publication No. 2002-170376).

Figure 9:
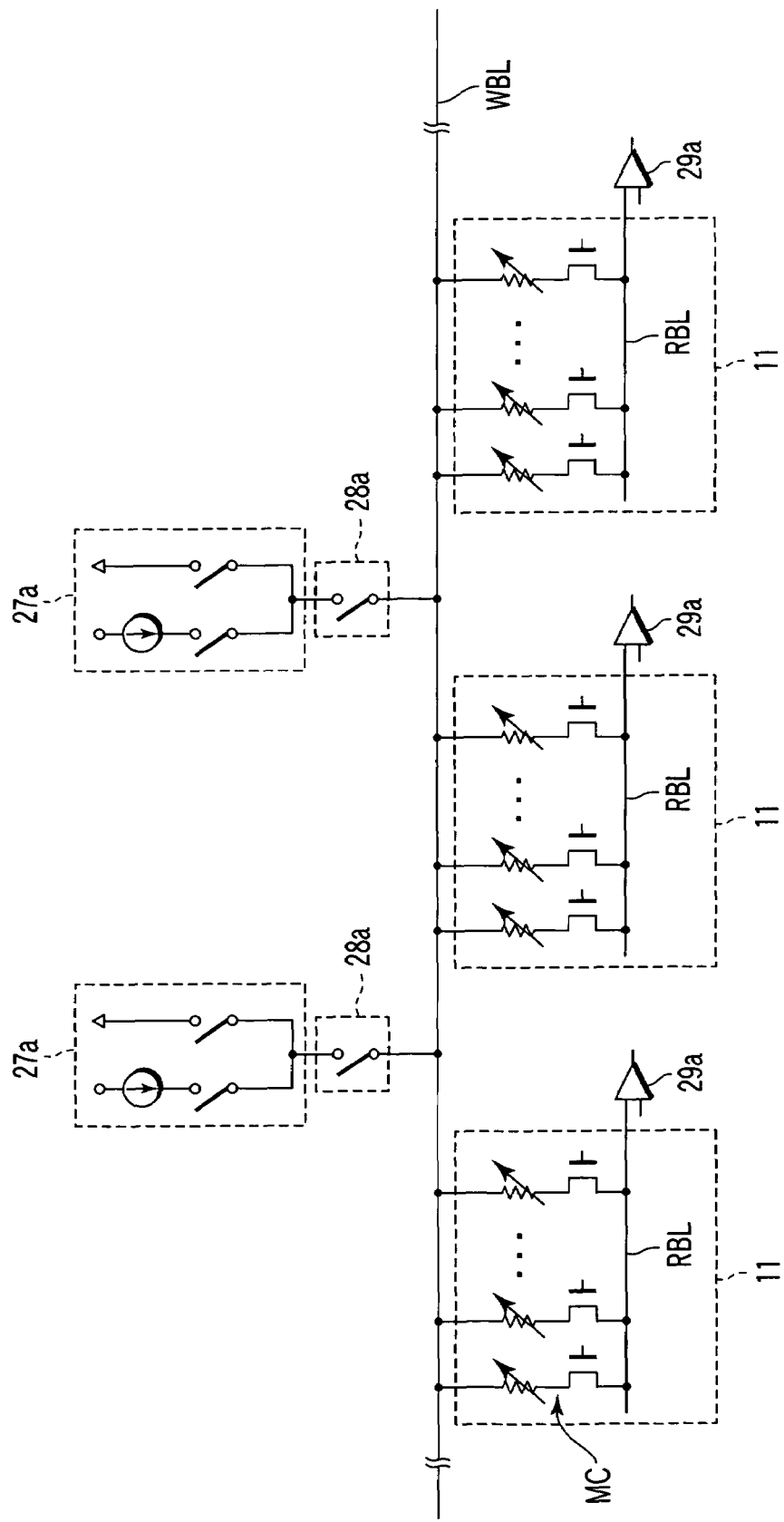
FIG. 9 is a circuit diagram illustrating a major section of an MRAM according to a second embodiment of the invention.

FIG. 9 is a circuit diagram illustrating a major section of the MRAM according to the second embodiment of the invention. The second embodiment has a plurality of read bit lines RBL and a plurality of memory cell arrays 11. The read bit lines RBL are provided for the memory cell arrays 11, respectively. The selection transistors 13 included in each memory cell array 11 are connected at source terminal to one read bit line RBL.

The read circuit 29 of the second embodiment comprises a plurality of sense amplifier circuits 29a. The sense amplifier circuits 29a are provided for, and connected to, the read bit lines RBL, respectively.

A description will be given of read operation of the MRAM constructed as the above. First, the write bit line WBL is set to the ground potential Vss by, for example, the write bit-line power-supply circuit 27. Next, the read word line RWL connected to the memory cell MC from which data should be read is activated (set to high level, in the second embodiment). The selection transistor 13 included in the memory cell MC is therefore turned on. The sense amplifier circuit 29a reads data from the memory cell MC selected.

The data-writing circuit connected to the write bit line supplies a relatively large current. Therefore, the sizes of transistors which compose the data-writing circuit are large. The write bit line has a relatively large parasitic capacitance, which is composed of the capacitance of the write bit line and the diffusion capacitance of the transistors connected to the write bit line. The write circuit is not connected to the read bit line, and the read circuit, i.e., sense amplifier circuit, handles a small current in comparison with the write circuit. The read bit line RBL therefore has a smaller parasitic capacitance than the write bit line WBL. Hence, if the write bit line WBL is spaced apart from the read bit line RBL, the data-reading speed will increase, and the current used to read data can be reduced.

As has been described in detail, data can be read at high speed from the second embodiment since the read bit line RBL and the write bit line WBL are spaced apart from each other. In addition, the current used to read data can be reduced.

An MRAM in which memory cell array 11 is divided into a plurality of memory cell blocks BLK can operate in the same way as described above. In this case, too, similar advantages can be achieved.

Figure 10:
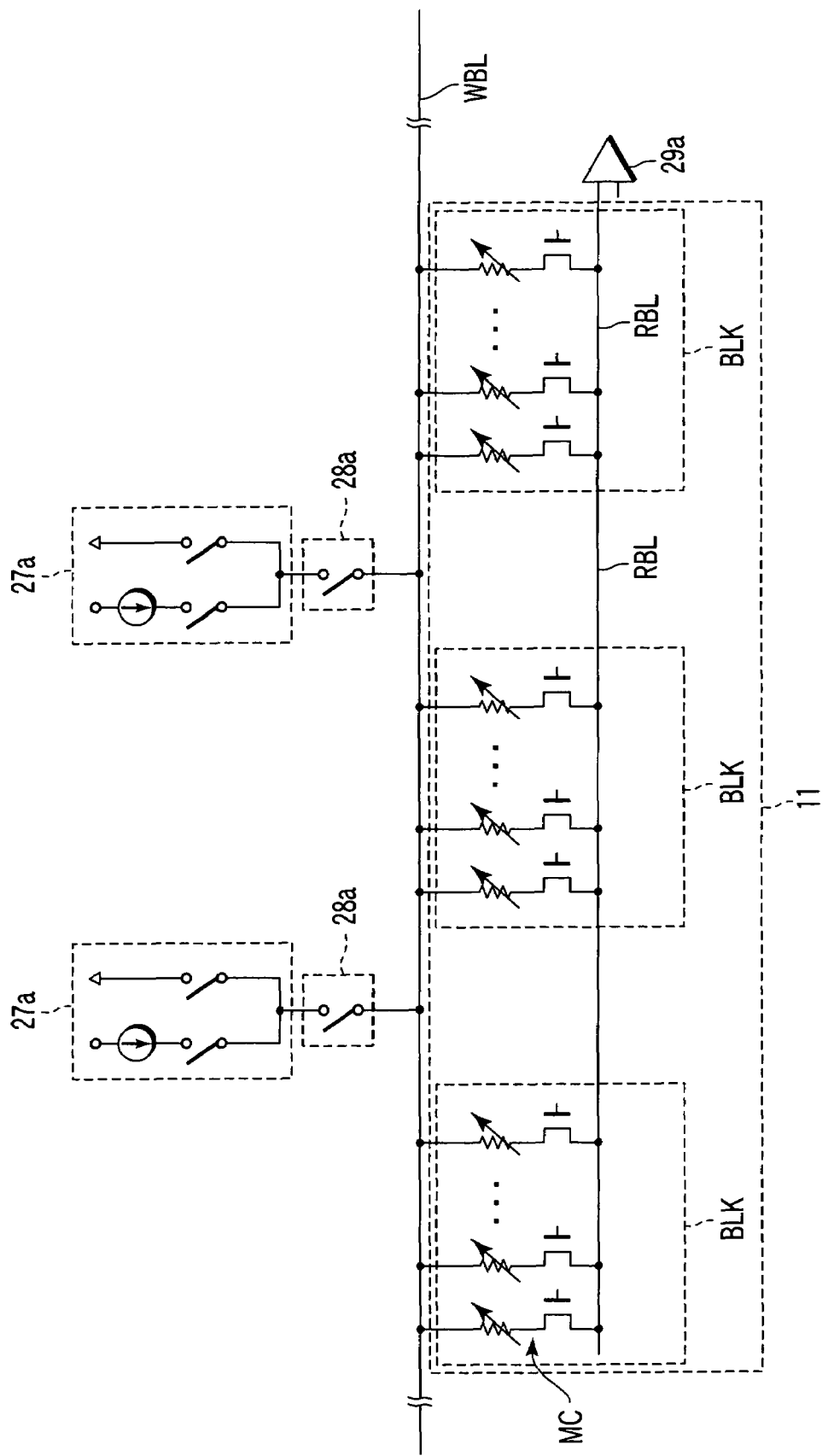

If the memory cell array 11 is divided into the plurality of memory cell blocks BLK, the memory cell blocks BLK may share a sense amplifier circuit 29a (see FIG. 10). In this case, too, similar advantages can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   one write line;
   at least three first data-writing circuits which are connected to the one write line; and
   memory cells which include a magnetoresistive element, are connected electrically and/or magnetically to the one write line, and are arranged between the first data-writing circuits,
   wherein one of the first data-writing circuits includes,
      a first common power-supply line;
      a first current-supplying circuit;
      a first current-sinking circuit;
      a first switch circuit which controls electrical connection of the first current-supplying circuit to the first common power-supply line; and
      a second switch circuit which controls electrical connection of the first current-sinking circuit to the first common power-supply line.

2. The semiconductor memory device according to claim 1, wherein the first current-supplying circuit includes a constant-current source circuit.

3. The semiconductor memory device according to claim 1, further comprising:
   a third switch circuit which controls electrical connection of the first common power-supply line to the one write line.

4. The semiconductor memory device according to claim 1, further comprising:
   two first data-writing circuits which are connected to both ends of the one write line, respectively.

5. The semiconductor memory device according to claim 4, wherein no memory cell is arranged between two first data-writing circuits which are arranged at one end of the one write line.

6. The semiconductor memory device according to claim 1, wherein a number of first data-writing circuits which are activated in write operation is equal on both sides of a memory cell in which the data is written.

7. The semiconductor memory device according to claim 1, wherein two first switch circuits are provided, and are turned on to write data in a memory cell.

8. The semiconductor memory device according to claim 1, wherein two second switch circuits are provided, and are turned on to write data in a memory cell.

9. The semiconductor memory device according to claim 1, further comprising:
   two second data-writing circuits which are connected to both ends of the one write line, respectively,
   wherein one of the second data-writing circuits includes:
   a second common power-supply line;
   a second current-supplying circuit; and
   a second current-sinking circuit.

10. The semiconductor memory device according to claim 9, wherein the second current-supplying circuit supplies larger current than the first current-supplying circuit.

11. The semiconductor memory device according to claim 10, wherein total number of the first data-writing circuit and the second data-writing circuit, which are activated to write data in a memory cell, is at least three.

12. The semiconductor memory device according to claim 1, wherein the one write line is connected to one end of the memory cell, and a read line is connected to the other end of a memory cell.

13. The semiconductor memory device according to claim 12, further comprising:
   a read circuit which includes a sense amplifier circuit and is connected to the read line.

* * * * *